(12) United States Patent
Li et al.

(10) Patent No.: US 8,749,289 B2
(45) Date of Patent: Jun. 10, 2014

(54) MULTI-PHASE CLOCK GENERATION APPARATUS AND METHOD

(75) Inventors: Shenggao Li, Pleasanton, CA (US); Roan M. Nicholson, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 178 days.

(21) Appl. No.: 13/330,648

(22) Filed: Dec. 19, 2011

(65) Prior Publication Data

US 2013/0154691 A1 Jun. 20, 2013

(51) Int. Cl.
*H03K 27/00* (2006.01)

(52) U.S. Cl.
USPC .......................................... 327/291; 327/293

(58) Field of Classification Search
USPC ......... 327/261, 263, 264, 268, 272, 276–278, 327/284, 285, 270, 283, 290, 291, 293
See application file for complete search history.

(56) References Cited

U.S. PATENT DOCUMENTS

| | | | | |
|---|---|---|---|---|
| 6,130,564 | A * | 10/2000 | Wang | 327/117 |
| 7,940,104 | B2 * | 5/2011 | Yoshizawa et al. | 327/291 |
| 8,154,352 | B2 * | 4/2012 | Ueno | 331/57 |
| 8,217,725 | B2 * | 7/2012 | Kondou | 331/57 |
| 8,502,585 | B2 * | 8/2013 | Kuenemund et al. | 327/208 |

OTHER PUBLICATIONS

Shenggao Li et al., "Clock Generation for a 32nm Server Processor with Scalable Cores," IEEE International Solid-State Circuits Conference, Feb. 21, 2011.

* cited by examiner

*Primary Examiner* — Hai L Nguyen
(74) *Attorney, Agent, or Firm* — Schwabe, Williamson & Wyatt, P.C.

(57) ABSTRACT

A multi-phase clock generator may receive an input clock signal as an input. The clock generator may also receive an inverse of the input clock signal. The clock generator may produce a plurality of output clock signals having different phases. The phases of the output clock signals may be evenly spaced. The output clock signals may have a similar waveform to the input clock signal, with a frequency that is lower than the input clock signal by a division factor.

16 Claims, 6 Drawing Sheets

STATE TRANSITION TABLE
A, B, C, D = {0, 1}; <u>A</u> = inv(A)

| | Output Node (as shown in Figure 1) | | | | | | | |
|---|---|---|---|---|---|---|---|---|
| | 108a | 108b | 108c | 108d | 108e | 108f | 108g | 108h |
| | Output clock signal (as shown in Figures 1 and 2) | | | | | | | |
| Edge of CK | Φ1 | Φ6 | Φ3 | Φ8 | Φ5 | Φ2 | Φ7 | Φ4 |
| Init. | A | B | C | D | <u>A</u> | <u>B</u> | <u>C</u> | <u>D</u> |
| 1 | A | <u>A</u> | C | <u>C</u> | <u>A</u> | A | <u>C</u> | C |
| 2 | <u>C</u> | <u>A</u> | A | <u>C</u> | C | A | <u>A</u> | C |
| 3 | <u>C</u> | C | A | <u>A</u> | C | <u>C</u> | <u>A</u> | A |
| 4 | <u>A</u> | C | <u>C</u> | <u>A</u> | A | <u>C</u> | C | A |
| 5 | <u>A</u> | A | <u>C</u> | C | A | <u>A</u> | C | <u>C</u> |
| 6 | C | A | <u>A</u> | C | <u>C</u> | <u>A</u> | A | <u>C</u> |
| 7 | C | <u>C</u> | <u>A</u> | A | <u>C</u> | C | A | <u>A</u> |
| 8 | A | <u>C</u> | C | A | <u>A</u> | C | <u>C</u> | <u>A</u> |

FIG. 3A

STATE TRANSITION TABLE
A, B, C, D = {0, 1}; A̲ = inv(A)

| Edge of CK | Output Node (as shown in Figure 1) | | | | | | | |
|---|---|---|---|---|---|---|---|---|
| | 108a | 108b | 108c | 108d | 108e | 108f | 108g | 108h |
| | Output clock signal (as shown in Figures 1 and 2) | | | | | | | |
| | Φ1 | Φ6 | Φ3 | Φ8 | Φ5 | Φ2 | Φ7 | Φ4 |
| Init. | A | B | C | D | A̲ | B̲ | C̲ | D̲ |
| 1 | D | B | B̲ | D | D̲ | B | B | D̲ |
| 2 | D | D̲ | B̲ | B | D̲ | D | B | B̲ |
| 3 | B | D̲ | D | B | B̲ | D | D̲ | B |
| 4 | B | B̲ | D | D̲ | B̲ | B | D̲ | D |
| 5 | D̲ | B̲ | B | D̲ | D | B | B̲ | D |
| 6 | D̲ | D | B | B̲ | D | D̲ | B̲ | B |
| 7 | B̲ | D | D̲ | B̲ | B | D̲ | D | B |
| 8 | B̲ | B | D̲ | D | B | B̲ | D | D |

FIG. 3B

MULTI-PHASE CLOCK GENERATION APPARATUS AND METHOD

TECHNICAL FIELD

This disclosure relates generally to electronic circuits. More particularly but not exclusively, the present disclosure relates to apparatuses and methods for multi-phase clock generators in electronic circuits.

BACKGROUND INFORMATION

Some electronic components, such as circuit-level devices, integrated-circuit-level devices, board-level devices, and system-level devices, use a multi-phase clock signal. Typically, the multi-phase clock is generated by a ring oscillator, a delay locked loop (DLL), or logic dividers with an external reset or initialization.

However, the circuitry that generates the multi-phase clock generally do not operate at low voltage, have relatively narrow bandwidth support, do not have good noise characteristics, and consume a large amount of power. Moreover, an external reset or initialization for such circuitry does not provide adequate design robustness.

BRIEF DESCRIPTION OF THE DRAWINGS

Non-limiting and non-exhaustive embodiments are described with reference to the following figures, wherein like reference numerals refer to like parts throughout the various views unless otherwise specified.

FIG. 3A illustrates a state transition table for the 8-phase clock generator of FIG. 1, in accordance with various embodiments;

FIG. 3B illustrates an alternative state transition table for the 8-phase clock generator of FIG. 1, in accordance with various embodiments;

DETAILED DESCRIPTION

Figure 1:
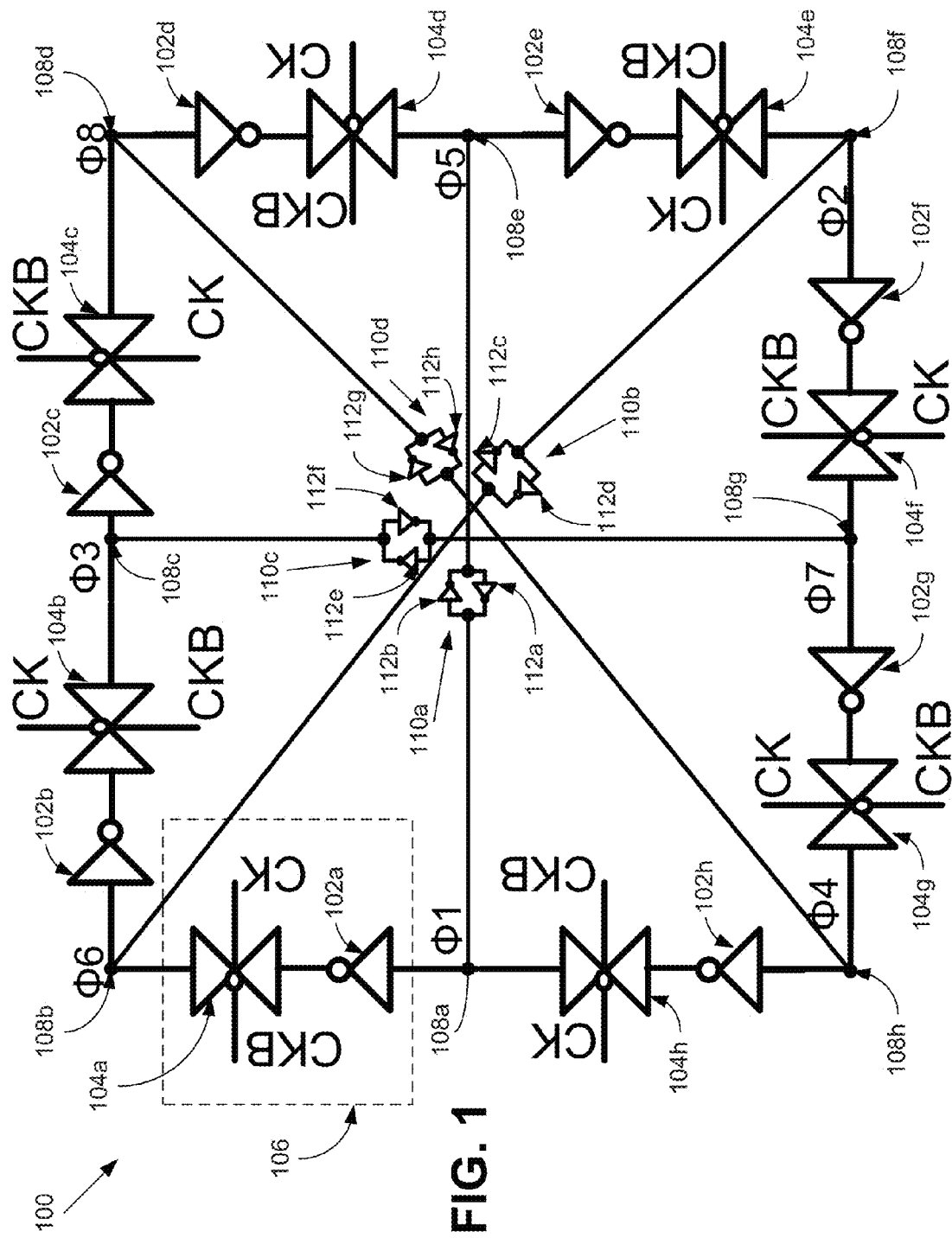
FIG. 1 is a circuit diagram that illustrates an 8-phase clock generator, in accordance with various embodiments.

Embodiments of a method and apparatus for multi-phase clock generation are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various embodiments provide a multi-phase clock generator. The multi-phase clock generator may comprise an electronic circuit. The multi-phase clock generator may receive complementary clock signals CK and CKB. In one embodiment, clock signal CKB may be approximately the inverse of clock signal CK. Clock signals CK and CKB may be provided to the multi-phase clock generator by an external clock generator, such as a complementary metal-oxide-semiconductor clock tree. The multi-phase clock generator may produce output clock signals having a plurality of phases. In some embodiments, the phases of the output clock signals may be evenly spaced from one another. The output clock signals may have a similar waveform to clock signal CK (e.g., generally shaped as a square wave), with a frequency that is equal to the clock frequency divided by a division factor. The division factor may be an integer.

In various embodiments, a quantity of the output nodes in the multi-phase clock generator may be equal to an integer power of two that is greater than four (e.g., 4, 8, 16, 32, etc.). In some embodiments, the division factor may be equal to half of the quantity of output nodes.

For example, in one embodiment, the multi-phase clock generator may be an 8-phase clock generator. The 8-phase clock generator may produce eight output clock signals, each having a similar waveform (e.g., generally shaped as a square wave) with a different phase. The phases of the eight output clock signals may be evenly spaced (e.g., separated by approximately 45 degrees from one another). The frequency of the output clock signals may be, for example, one fourth the frequency of the input clock signal CK.

Various embodiments may provide a circuit including a plurality of stages arranged in a ring with an output terminal of each stage coupled to an input terminal of an adjacent or next stage at an output node. Each stage may be configured to receive the complementary input clock signals CK and CKB at first or second clock terminals. In some embodiments, the configuration of clock signals CK and CKB may alternate around the ring, so that half the stages receive clock signal CK at the first clock terminal and clock signal CKB at the second clock terminal, and the other half of the stages receive clock signal CKB at the first clock terminal and clock signal CK at the second clock terminal.

Each stage may produce an output signal at the output terminal that is a delayed and inverted version of an input signal received at the input terminal. The output signal may be a frequency divided version of the first clock signal and/or the second clock signal.

The electronic circuit may further include a plurality of latch structures, each latch structure coupled between a pair of output nodes approximately positioned halfway around the ring from one another, the latch structure configured to cause output clock signals at the pair of output nodes to be inverses of one another. Each output node may be coupled to another output node by one of the latch structures.

One embodiment may provide a clock generation apparatus including a plurality of stages arranged in a ring with an output terminal of each stage coupled to an input terminal of a next stage at an output node, each stage configured to receive complementary input clock signals at respective first and second clock terminals and to receive a prior output signal from a prior stage at the input terminal and produce an output signal at the output terminal that is an inverted and delayed version of the prior output signal; and a plurality of latch structures, each latch structure being configured to cause an output signal at a respective output node to be the inverse of another output signal at a respective other output node; wherein the output signals at each output node have different phases.

In one embodiment, the output signals may be frequency divided versions of a first input clock signal of the complementary input clock signals.

In one embodiment, each stage may include an inverter coupled to a transmission gate. In another embodiment, each stage may include a gated inverter.

Another embodiment may provide a method of clock generation, including receiving a first input clock signal at a first clock terminal of a first stage, the first stage being one of a plurality of stages arranged in a ring with an output terminal of each stage coupled to an input terminal of a next stage at an output node; receiving a second input clock signal at a second clock terminal of the first stage; receiving, at a first input terminal of the first stage, a first output clock signal; and outputting a second output clock signal at a first output terminal of the first stage, the second output clock signal having a logical level that is an inverse of a logical level of the first output clock signal if the first input clock signal has a first logic state; wherein output clock signals at different output nodes of the ring are inverses of one another.

Another embodiment may provide a computing system including a microprocessor having one or more processor cores, at least one of the processor cores including an eight-phase clock generator. The eight-phase clock generator may include eight stages arranged in a ring with an output terminal of each stage coupled to an input terminal of a next stage at an output node, each stage configured to receive complementary input clock signals at respective first and second clock terminals and to produce an output signal at the output terminal that is a delayed and inverted version of an input signal at the input terminal; and a plurality of latch structures, each latch structure coupled between a pair of output nodes positioned halfway around the ring from one another, the latch structure configured to cause output clock signals at the pair of output nodes to be inverses of one another.

A further embodiment may provide a clock generation apparatus including a plurality of output nodes; a plurality of stages arranged in a ring, each stage including an inverter and a transmission gate and coupled to a next stage at a corresponding output node; and one or more pairs of cross-coupled inverters, the cross-coupled inverters coupled between opposing pairs of output nodes on the ring.

FIG. 1 shows a circuit 100 in accordance with various embodiments. Circuit 100 may be an 8-phase clock generator. Circuit 100 may include eight stages, with each stage respectively including an inverter 102*a-h* and a transmission gate 104*a-h*.

For example, an outline of a first stage 106 is shown in broken lines in FIG. 1. First stage 106 may include inverter 102*a* and transmission gate 104*a* coupled to inverter 102*a*. The eight stages may be coupled to one another in a ring, with the output terminal of each stage being fed to the input terminal of the next stage at respective output nodes 108*a-h* of circuit 100.

Circuit 100 may further include four latch structures 110*a-d*. In one embodiment, latch structures 110*a-d* may each include a corresponding pair of back-to-back coupled inverters 112*a-h* (e.g., with the input terminal of a first inverter of the pair coupled to the output terminal of a second inverter of the pair, and the input terminal of the second inverter coupled to the output terminal of the first inverter). The back-to-back coupled inverters 112*a-h* may also be referred to as cross-coupled inverters 112*a-h*.

Each latch structure 110*a-d* may be coupled between two output nodes 108*a-h* that may be evenly spaced from one another on circuit 100 (e.g., each output node is coupled to another output node that is halfway around the ring of circuit 100). For example, latch structure 110*a* is coupled between output node 108*a* and output node 108*e* that is halfway round the ring of circuit 100.

In various embodiments, circuit 100 may receive complementary input clock signals CK and CKB, and may produce eight output clock signals φ1, φ2, φ3, φ4, φ5, φ6, φ7, and φ8 at corresponding output nodes 108*a*, 108*f*, 108*c*, 108*h*, 108*e*, 108*b*, 108*g*, and 108*d*, as labeled in FIG. 1. Each transmission gate 104*a-h* may have a pair of clock terminals, including a p-gate (denoted in FIG. 1 with a circle) and an n-gate, that respectively receive clock signals CK or CKB. The clock terminals to which clock signals CK and CKB are coupled may be alternated between successive transmission gates 104*a-h*. For example, transmission gates 104*a*, 104*c*, 104*e*, and 104*g* may receive clock signal CK at the n-gate and clock signal CKB at the p-gate, while transmission gates 104*b*, 104*d*, 104*f*, and 104*h* may receive clock signal CK at the p-gate and clock signal CKB at the n-gate.

The particular transmission gate 104*a-h* may be on if the input clock signal at the n-gate is at a logic 1 and the input clock signal at the p-gate is at a logic 0. If the particular transmission gate 104*a-h* is on, the output of the particular transmission gate 104*a-h* may be the inverse of the input to the corresponding inverter 102*a-h*. Conversely, the particular transmission gate 104*a-h* may be off if the input clock signal at the n-gate is at a logic 0 and the input clock signal at the A-gate is at a logic 1. If the particular transmission gate 104*a-h* is off, the particular transmission gate 104*a-h* holds the previous output (e.g., if the output of the transmission gate is a logic 0 if the particular transmission gate 104*a-h* turns off, the output of that particular transmission gate 104*a-h* remains at logic 0).

The latch structures 110*a-d* may cause the output clock signals at the pair of output nodes to which the latch structure 110*a-d* is coupled to be inverses of one another. For example, output clock signal φ5 may be the inverse of output clock signal φ1, and output clock signal φ6 may be the inverse of output clock signal φ2. Additionally, each stage may produce an output signal at the output terminal that is an inverted and delayed version of the input signal at the input terminal (e.g., the output signal from the previous stage, also referred to as the prior output signal). This arrangement of circuit 100 may produce eight output clock signals (e.g., φ1, φ2, . . . , φ8) at respective output nodes, with the output clock signals having equally spaced phases and each output clock signal having a frequency that is one-fourth the frequency of clock signal CK.

Figure 2:
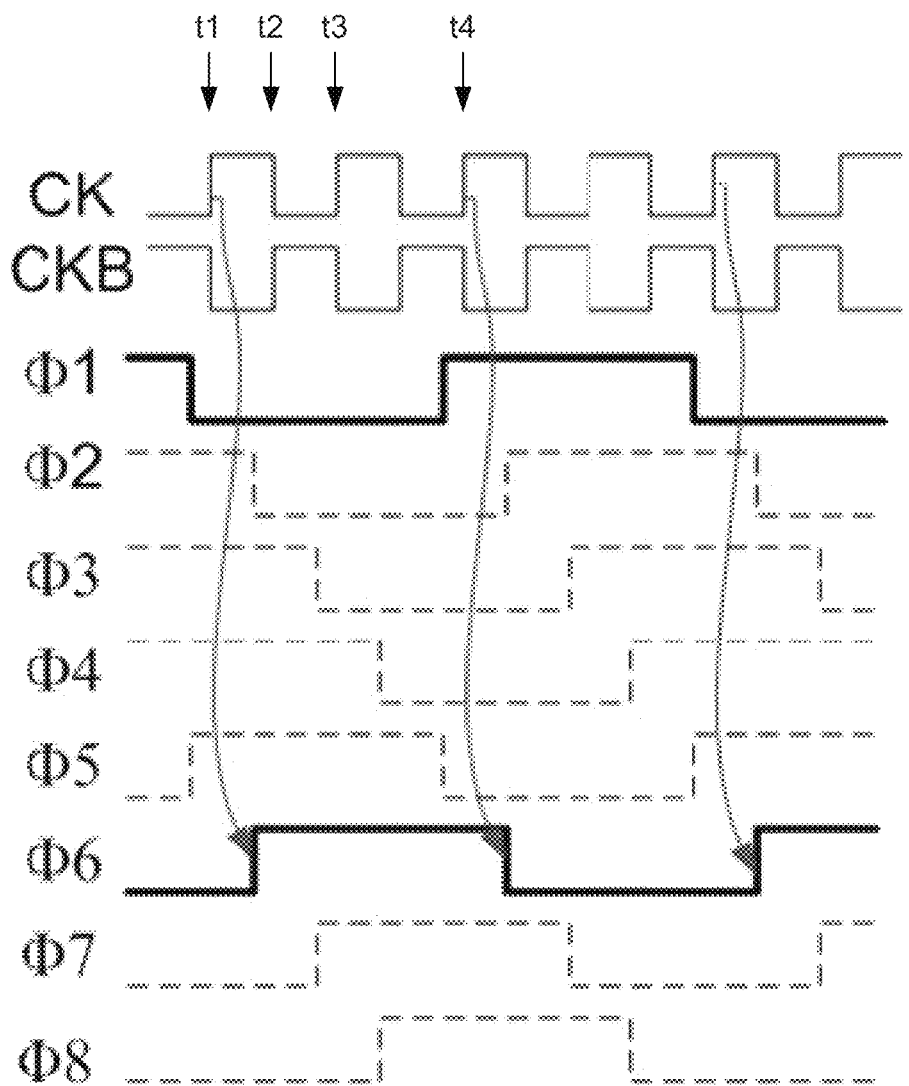
FIG. 2 illustrates signal diagrams in accordance with various embodiments, including example output clock signals of the 8-phase clock generator of FIG. 1.

To illustrate, FIG. 2 shows an embodiment of clock signals CK and CKB, and also shows the corresponding output clock signals produced by circuit 100. As shown in FIG. 2, clock signal CK may be a generally square wave, with an approximately 50% duty cycle, and clock signal CKB may be the inverse of clock signal CK. At time t1, if clock signal CK rises to a logic 1, transmission gate 104*a* is turned on, causing the output clock signal φ6 at output node 108*b* to be the inverse of the output clock signal φ1 at output node 108*a*. At, this point, output clock signal φ1 is a logic 0, and so output clock signal φ6 becomes a logic 1. The switching of output clock signal φ6 is delayed by 90 degrees of the period of CK because of the feedback loop caused by latch structure 110*a*. At time t2, if CK drops to logic 0, output clock signal φ6 holds its value (e.g., logic 1). At time t3, if CK rises to logic 1 again, output clock signal φ1 remains at logic 0, and so output clock signal φ6 remains at logic 1. However, at time t4 (two full cycles of clock signal CK after t1), if clock signal CK rises to logic 1, output clock signal φ1 is at logic 1, and so output clock signal φ6 switches to logic 0. A similar sequence occurs between all adjacent stages (e.g., from output clock signals φ6 to φ3, from output clock signal φ3 to φ8, etc.).

As shown in FIG. 2 and discussed above, the output clock signals φ1, φ2, φ3, φ4, φ5, φ6, φ7, and φ8 may have a frequency that is one-fourth the frequency of clock signal CK. The phase of the output clock signals may be equally spaced from one another. As shown in FIG. 1, the output clock signals φ1, φ2, φ3, φ4, φ5, φ6, φ7, and φ8, as ordered by phase, may not be located on sequential output nodes 108a-h of circuit 100. For example, output clock signal φ2 follows output clock signal φ5 (e.g., the inverse of output clock signal φ1), and output clock signal φ3 follows output clock signal φ6 (e.g., the inverse of clock signal φ2) on circuit 100.

In various embodiments, the latch structures 110a-d may ensure that the circuit 100 will produce the eight equally spaced output clock signals regardless of the initial state (e.g., logical 0 or 1) of each output node upon power up of circuit 100. Accordingly, circuit 100 may not require an external reset or initialization circuit.

To illustrate, FIGS. 3A and 3B are state transition tables showing the two possible outcomes of one embodiment of the circuit 100 if starting from an arbitrary initial state. The initial state of each output node is represented by a letter A, B, C, or D, where each of A, B, C, and D may be either 0 or 1. The representation "Ā" refers to the inverse of A. The initial states of output clock signals φ5, φ2, φ7, and φ4 may be the inverses of the initial states of output clock signals φ1, φ6, φ3, and φ8, respectively, because of latch structures 110a-d. The output clock signals may repeat themselves after eight transitions (e.g., edges) of clock signal CK. Two transitions (e.g., one rising edge and one falling edge) may occur in each full cycle of clock signal CK.

Which of the two transition tables (e.g., FIG. 3A or FIG. 3B) will apply may depend on if the first transition of CK after powering on circuit 100 is a rising edge (e.g., logical 0 to logical 1) or a falling edge (e.g., logical 1 to logical 0). If the first transition of clock signal CK is a rising edge, then FIG. 3A may apply. This is because the rising edge of CK may cause transmission gates 104a, 104c, 104e, and 104g to be on, while transmission gates 104b, 104d, 104f, and 104h may be off after the first transition of clock signal CK. However, if the first edge of clock signal CK is a falling edge, then FIG. 3B may apply. The falling edge of clock signal CK may cause transmission gates 104b, 104d, 104f, and 104h to be on, while transmission gates 104a, 104c, 104e, and 104g may be off after the first transition of clock signal CK.

As shown by the transition tables in FIGS. 3A and 3B, circuit 100 may produce eight output clock signals with evenly spaced phases regardless the initial state of the output nodes 108a-h upon startup of the circuit 100 (e.g., regardless of whether initial states A, B, C, and/or D is a logical 0 or a logical 1). The frequency of the output clock signals may be one-fourth the frequency of clock signal CK. Accordingly, circuit 100 may not require an external reset and/or initialization circuit.

In some embodiments, circuit 100 may include only inverters 102a-h and 112a-h and transmission gates 104a-h, as shown in FIG. 1. The inverters 102a-h and 112a-h and transmission gates 104a-h may omit stacked transistors (e.g., may not include more than one transistor on a conductive path between the input and output of the inverter or transmission gate). Accordingly, circuit 100 may be able to operate at a low voltage (e.g., about 0.7 V or higher). Additionally, one embodiment of circuit 100 may be able to operate over a wide range of frequencies of clock signal CK. For example, clock signal CK may be from a frequency of close to direct current (DC) to over 20 gigahertz (GHz). The upper limit of the frequency may be determined by the delay of the inverters 102a-h and/or transmission gates 104a-h.

Figure 4:
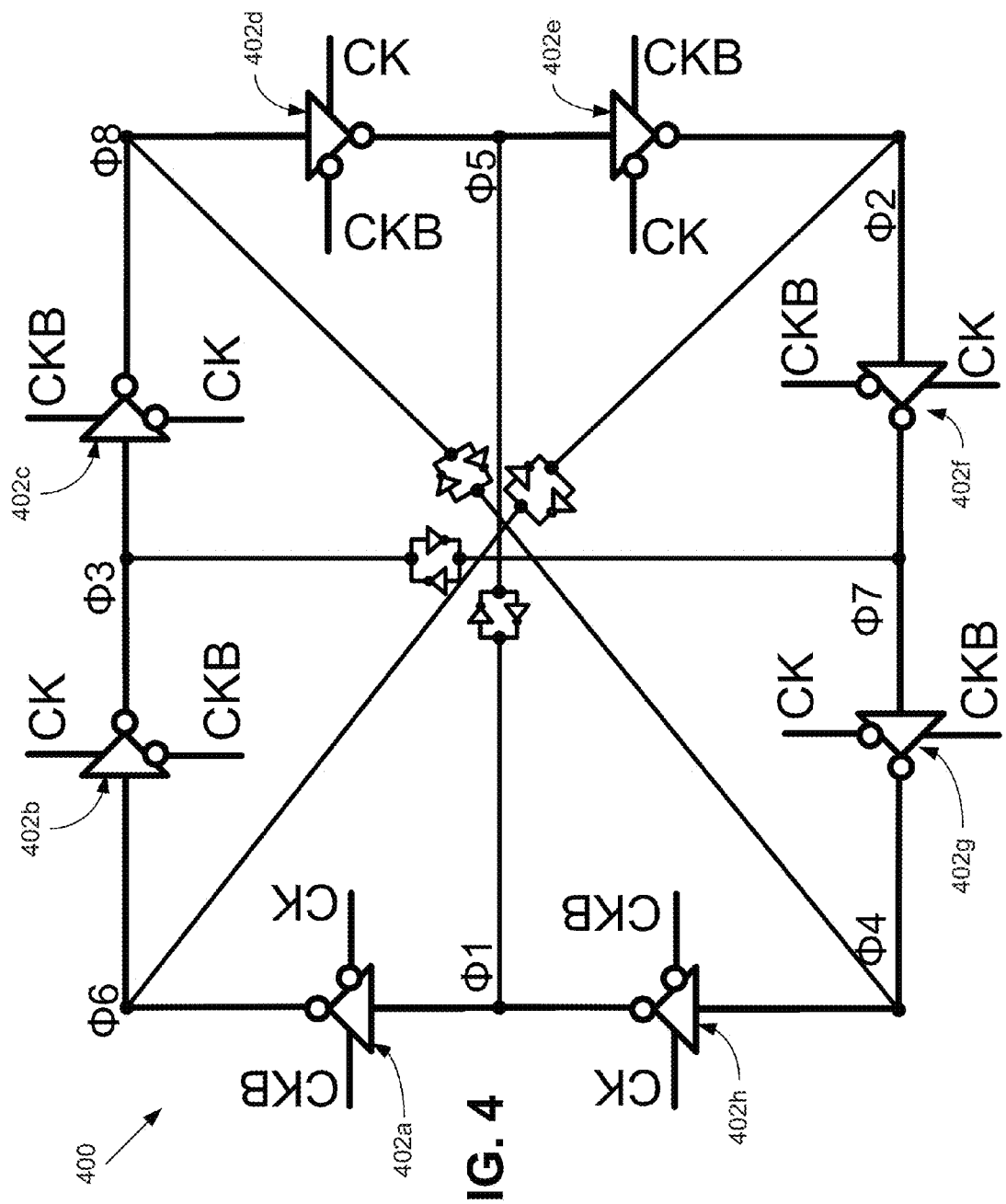
FIG. 4 illustrates a circuit diagram of another embodiment of an 8-phase clock generator.

FIG. 4 shows a circuit 400 in accordance with various embodiments. Circuit 400 is an alternative embodiment of an 8-phase clock generator. Circuit 400 may be similar to circuit 100, except circuit 400 may include a gated inverter 402a-h at each stage instead of a separate inverter and transmission gate. Gated inverters 402a-h may each have a p-gate (denoted in FIG. 4 with a circle) and an n-gate, that receive input clock signals CK or CKB. If the input clock signal at the n-gate is at a logic 1, and the input clock signal at the p-gate is at a logic 0, the output of the particular gated inverter 402a-h may be the inverse of the input of that particular gated inverter 402a-h. Conversely, if the input clock signal at the n-gate is at a logic 0 and the input clock signal at the p-gate is at a logic 1, the particular gated inverter 402a-h holds the previous output (e.g., if the output of the transmission gate is a logic 0 if the particular gated inverter 402a-h turns off, the output of that particular gated inverter 402a-h remains at logic 0).

Circuit 400 may produce eight output clock signals with equally spaced phases and a frequency that is one-fourth the frequency of clock signal CK. In some embodiments, the gated inverters 402a-h may include stacked transistors. Accordingly, circuit 400 may use a higher operating voltage than circuit 100.

Figure 5:
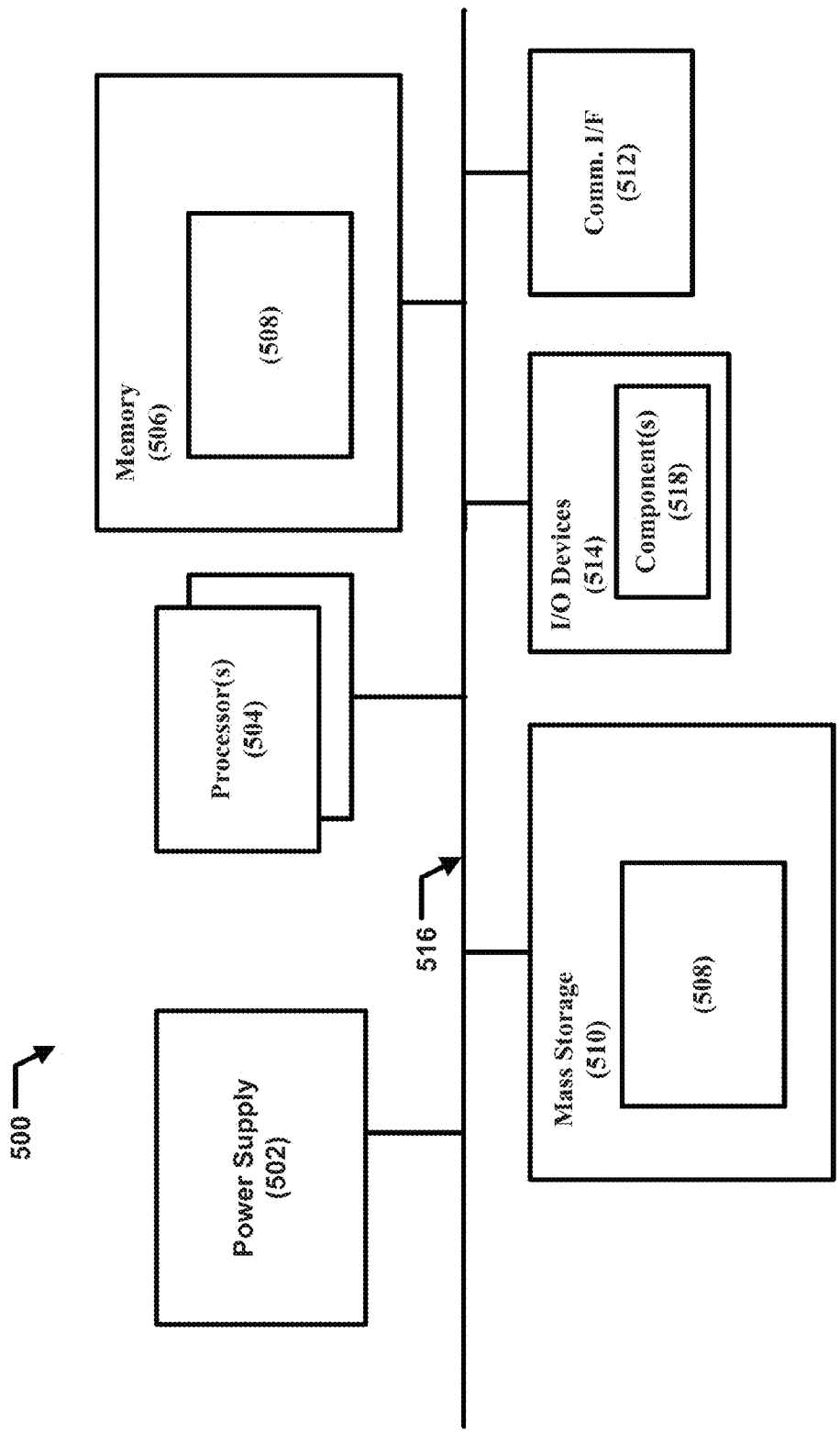
FIG. 5 is a block diagram that illustrates an example computer system suitable to practice the disclosed embodiments.

Embodiments of the multi-phase clock generator described herein may be used in a number of implementations and applications, such as wireline communications, wireless communication systems, and/or various chip-to-chip interfaces. For example, mobile devices, including but not limited to smart phones, nettops, tablets and other Mobile Internet Devices (MIDs) may have clock generators to facilitate communications with other devices and/or between circuits or components of the mobile device. Also, microprocessors may include a clock generator to facilitate operation of the microprocessor and communications between various domains of the microprocessor and/or between the microprocessor and other components of the device. Some microprocessors may include a plurality of cores, and a multi-phase clock generator may facilitate communications between the cores of the microprocessor. FIG. 5 is a block diagram that illustrates an example computer system 500 suitable to practice the disclosed disable circuit/method of various embodiments.

As shown, the computer system 500 may include a power supply unit 502, a number of processors or processor cores 504, a system memory 506 having processor-readable and processor-executable instructions 508 stored therein, a mass storage device 510 that may also store the instructions 508, and a communication interface 512. For the purpose of this application, including the claims, the terms "processor" and "processor cores" may be considered synonymous, unless the context clearly requires otherwise.

The one or more mass storage devices 510 and/or the memory 506 may comprise a tangible, non-transitory computer-readable storage device (such as a diskette, hard drive, compact disc read only memory (CDROM), hardware storage unit, and so forth). The computer system 500 may also comprise input/output devices 514 (such as a keyboard, display screen, cursor control, and so forth). According to various embodiments, one or more of the depicted components of the system 500 and/or other element(s) may include a keyboard, LCD screen, non-volatile memory port, multiple antennas, graphics processor, application processor, speakers, or other associated mobile device elements, including a camera.

In various embodiments, at least one processor 504 and/or other component(s) 518 may include a multi-phase clock generator (such as the circuit 100 of FIG. 1 and/or the circuit 400 of FIG. 4). In one embodiment, the multi-phase clock generator may facilitate data throughput between processor cores 504.

The various elements of FIG. 5 may be coupled to each other via a system bus 516, which represents one or more buses. In the case of multiple buses, they may be bridged by one or more bus bridges (not shown). Data may pass through the system bus 516 through the I/O devices 514, for example, between the component(s) 518 and the processors 504.

The system memory 506 and the mass storage device 510 may be employed to store a working copy and a permanent copy of the programming instructions implementing one or more operating systems, firmware modules or drivers, applications, and so forth, herein collectively denoted as 508. The permanent copy of the programming instructions may be placed into permanent storage in the factory, or in the field, through, for example, a distribution medium (not shown), such as a compact disc (CD), or through the communication interface 512 (from a distribution server (not shown)).

The remaining constitution of the various elements of the computer system 500 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

These and other modifications can be made in light of the above detailed description. The terms used in the following claims should not be construed to be limited to the specific embodiments disclosed in the specification.

What is claimed is:

1. A clock generation apparatus, comprising:
a plurality of stages arranged in a ring with an output terminal of each stage coupled to an input terminal of a next stage at an output node, each stage configured to receive complementary input clock signals at respective first and second clock terminals and to receive a prior output signal from a prior stage at the input terminal and produce an output signal at the output terminal that is an inverted and delayed version of the prior output signal, wherein individual stages are gated to pass an inverted version of the prior output signal from the prior stage as the output signal at the output terminal responsive to the complementary input clock signals; and
a plurality of latch structures, each latch structure being configured to cause an output signal at a respective output node to be the inverse of another output signal at a respective other output node;
wherein the output signals at each output node have different phases.

2. The apparatus of claim 1, wherein to provide the output signal that is the inverted and delayed version of the prior output signal, each stage is configured to produce the output signal at the output terminal that is an inverse of the prior output signal at the input terminal if the input clock signal at the first clock terminal has a first logic state and to hold the output signal at a current value if the input clock signal at the first clock terminal has a second logic state.

3. The apparatus of claim 2, wherein the complementary clock signals include first and second clock signals, the second clock signal being approximately an inverse of the first clock signal, and wherein successive stages around the ring alternate between being configured to receive the first clock signal at the first clock terminal and the second clock signal at the second clock terminal and being configured to receive the second clock signal at the first clock terminal and the first clock signal at the second clock terminal.

4. The apparatus of claim 1, wherein each output node is coupled to another output node by one of the plurality of latch structures, the other output node positioned halfway around the ring from the output node.

5. The apparatus of claim 1, wherein a quantity of the plurality of stages is equal to an integer power of two greater than or equal to four.

6. The apparatus of claim 1, wherein each stage includes an inverter coupled to a transmission gate.

7. The apparatus of claim 6, wherein none of the inverters or transmission gates includes more than one transistor on a conductive path between an input terminal and an output terminal of the inverter or transmission gate.

8. The apparatus of claim 1, wherein the output signals are frequency divided versions of a first input clock signal of the complementary input clock signals.

9. The apparatus of claim 1, wherein each latch structure includes a pair of inverters coupled back-to-back.

10. The apparatus of claim 1, wherein each stage includes a gated inverter.

11. A method of clock generation, comprising:
receiving a first input clock signal at a first clock terminal of a first stage, the first stage being one of a plurality of stages arranged in a ring with an output terminal of each stage coupled to an input terminal of a next stage at an output node;
receiving a second input clock signal at a second clock terminal of the first stage;
receiving, at a first input terminal of the first stage, a first output clock signal;
outputting a second output clock signal at a first output terminal of the first stage, the second output clock signal having a logical level that is an inverse of a logical level of the first output clock signal if the first input clock signal has a first logic state; and
holding the second output clock signal at a current logical level, by the first stage at the output terminal of the first stage, if the first input clock signal has a second logic state; wherein individual stages are gated to pass an inverted version of the prior output signal from the prior stage as the output signal at the output terminal responsive to the complementary input clock signals, and
wherein output clock signals at different output nodes of the ring are inverses of one another.

12. The method of claim 11, further comprising:
inverting, by respective latch structures, the output clock signals at each output node to form output clock signals at another output node, the other output node positioned halfway around the ring from the output node.

13. A computing system, comprising:
   a microprocessor having one or more processor cores, at least one of the processor cores including an eight-phase clock generator having:
   eight stages arranged in a ring with an output terminal of each stage coupled to an input terminal of a next stage at an output node, each stage configured to receive complementary input clock signals at respective first and second clock terminals and to produce an output signal at the output terminal that is a delayed and inverted version of an input signal at the input terminal, wherein individual stages are gated to pass an inverted version of the input signal from the prior stage as the output signal at the output terminal responsive to the complementary input clock signals; and
   a plurality of latch structures, each latch structure coupled between a pair of output nodes positioned halfway around the ring from one another, the latch structure configured to cause output clock signals at the pair of output nodes to be inverses of one another.

14. The system of claim 13, wherein the output signals are frequency divided versions of a first input clock signal of the complementary input clock signals.

15. The system of claim 13, wherein each stage includes an inverter coupled to a transmission gate.

16. The system of claim 13, wherein each latch structure includes a pair of inverters coupled back-to-back between the pair of output nodes.

* * * * *